(12) United States Patent
Ulrich et al.

(10) Patent No.: US 7,920,338 B2
(45) Date of Patent: Apr. 5, 2011

(54) REDUCTION PROJECTION OBJECTIVE AND PROJECTION EXPOSURE APPARATUS INCLUDING THE SAME

(75) Inventors: Wilhelm Ulrich, Aalen (DE); Aurelian Dodoc, Heidenheim an der Brenz (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1018 days.

(21) Appl. No.: 11/723,854

(22) Filed: Mar. 22, 2007

(65) Prior Publication Data

US 2007/0252094 A1 Nov. 1, 2007

Related U.S. Application Data

(60) Provisional application No. 60/786,361, filed on Mar. 28, 2006.

(51) Int. Cl.
G02B 17/08 (2006.01)

(52) U.S. Cl. .......................................... 359/727; 359/364

(58) Field of Classification Search .................. 359/362, 359/364–366, 726–737
See application file for complete search history.

(56) References Cited

U.S. PATENT DOCUMENTS

| | | | |
|---|---|---|---|
| 5,515,207 A | 5/1996 | Foo | |
| 5,636,066 A | 6/1997 | Takahashi | |
| 5,652,679 A | 7/1997 | Freeman | |
| 6,169,627 B1 | 1/2001 | Schuster | |
| 6,426,506 B1 | 7/2002 | Hudyma | |
| 6,590,718 B2 * | 7/2003 | Furter et al. | 359/732 |
| 6,600,608 B1 | 7/2003 | Shafer et al. | |
| 7,079,314 B1 | 7/2006 | Suenaga et al. | |
| 2002/0024741 A1 | 2/2002 | Terasawa et al. | |
| 2003/0011755 A1 | 1/2003 | Omura et al. | |
| 2003/0011894 A1 | 1/2003 | Schuster | |
| 2003/0197922 A1 | 10/2003 | Hudyma | |
| 2003/0197946 A1 | 10/2003 | Omura | |
| 2003/0234912 A1 | 12/2003 | Omura | |
| 2003/0234992 A1 | 12/2003 | Shafer | |
| 2004/0012866 A1 | 1/2004 | Mann et al. | |
| 2004/0130806 A1 | 7/2004 | Takahashi | |
| 2004/0160677 A1 | 8/2004 | Epple et al. | |
| 2005/0190435 A1 | 9/2005 | Shafer et al. | |

(Continued)

FOREIGN PATENT DOCUMENTS

DE 10332112 A1 1/2005

(Continued)

OTHER PUBLICATIONS

Willi Ulrich et al, "Trends in Optical Design of Projection Lenses for UV-and EUV-Lithography", Proc. of SPIE vol. 4146 (2000).

(Continued)

*Primary Examiner* — Darryl J Collins
(74) *Attorney, Agent, or Firm* — Sughrue Mion, PLLC (57) ABSTRACT

A reduction projection objective for projection lithography has a plurality of optical elements arranged along an optical axis and designed for imaging an effective object field arranged in an object surface of the projection objective into an effective image field arranged in an image surface of the projection objective at a reducing magnification ratio. The optical elements include at least one concave mirror. The optical elements are designed to provide an image-side numerical aperture NA>0.6 in a large effective image field having a maximum image field height Y'>25 mm. A compact, low mass projection objective enabling high throughput of exposed substrates is thereby obtained.

57 Claims, 3 Drawing Sheets

U.S. PATENT DOCUMENTS

2005/0248856 A1    11/2005    Omura et al.

FOREIGN PATENT DOCUMENTS

| | | |
|---|---|---|
| EP | 1 069 448 A1 | 1/2001 |
| EP | 1 098 215 A1 | 5/2001 |
| EP | 1 318 425 A2 | 6/2003 |
| EP | 1 336 887 A1 | 8/2003 |
| JP | 2002208551 A | 7/2002 |
| JP | 2002372668 A | 12/2002 |
| JP | 2003114387 A | 4/2003 |
| JP | 2004-317534 A | 11/2004 |
| JP | 2005003982 A | 1/2005 |
| WO | WO 92/05462 A2 | 4/1992 |
| WO | WO 94/06047 A1 | 3/1994 |
| WO | WO 01/04682 A1 | 1/2001 |
| WO | WO 01/51979 A2 | 7/2001 |
| WO | WO 01/55767 A2 | 8/2001 |
| WO | WO 01/59502 A1 | 8/2001 |
| WO | WO 03/036361 A1 | 5/2003 |
| WO | WO 2004/019128 A2 | 3/2004 |
| WO | WO 2004/107011 A1 | 12/2004 |
| WO | WO 2005/040890 A2 | 5/2005 |
| WO | WO 2005/059654 A1 | 6/2005 |
| WO | WO 2005/111689 A2 | 11/2005 |

OTHER PUBLICATIONS

E. Glatzel, "New Lenses for Microlithography", SPIE vol. 237 (1980), pp. 310-320.

Tomoyuki Matsuyama, et al, "High NA and Low Residual Aberration Projection Lens for Duv Scanner", SPIE, vol. 4691, (2002) pp. 687-695.

Tomoyuki Matsuyama, et al. "Microlithographic Lens for DUV Scanner", SPIE vol. 4832 Dec. 2002, Conference Jun. 3-7, 2003 pp. 170-174.

J.H. Bruning, "Optical Lithography—Thirty Years and Three Orders of Magnitude", SPIE vol. 3049, pp. 14-27.

Tomoyuki Matsuyama, et al "Nikon Projection Lens Update", in Optical Microlithography XVII, Proc. of SPIE , vol. 5377.65 (2004).

M.H. Freeman, "Innovative Wide-Field Binocular Design", OSA Proceedings of the International Optical Design Conference (OSA) 1994, vol. 22, pp. 389-393.

Donald Dejager, "Camera Viewfinder Using Tilted Concave Mirror Erecting Elements", SPIE vol. 237, 1980 International Lens Design Conference (OSA) pp. 292-298.

* cited by examiner

REDUCTION PROJECTION OBJECTIVE AND PROJECTION EXPOSURE APPARATUS INCLUDING THE SAME

This application claims the benefit of U.S. Provisional Application No. 60/786,361, filed Mar. 28, 2006. The disclosure of this Provisional Application is incorporated herein by reference.

BACKGROUND OF THE INVENTION

1. Field of the Invention

The invention relates to a reduction projection objective for imaging an effective object field arranged in an object surface of the projection objective onto an effective image field arranged in an image surface of the projection objective and a projection exposure apparatus including such projection objective.

2. Description of the Related Art

Reduction projection objectives are, for example, employed in projection exposure apparatuses used for fabricating semiconductor devices and other types of micro devices and serve to project patterns on photomasks or reticles, hereinafter referred to generically as "masks" or "reticles," onto an object having a photosensitive coating with ultrahigh resolution on a reduced scale.

A projection exposure apparatus for microlithography includes an illumination system for illuminating the mask, arranged in an exit surface of the illumination system, and a projection objective, following the mask, which is designed for creating an image of the pattern of the mask in the image surface of the projection objective, where the object to exposed is arranged. The exposure radiation provided by the projection objective is incident on the photosensitive substrate within an effective image field at an image-side numerical aperture NA of the projection objective.

It is generally desired that the projection objective has a sufficient correction status of all imaging aberrations for all field points within the effective image field in order to obtain the desired performance. The aberrations include chromatic aberrations, image curvature aberration, distortion, spherical aberrations, astigmatism etc. The entire effective object field should be imaged into the image surface without vignetting, i.e. without loss of information regarding critical field points, typically from the edge of the field.

In the manufacture of highly integrated semiconductor devices it is often desired that at least some layers of a three dimensionally structured semiconductor device are produced at conditions where the image-side numerical aperture and the selected operating wavelength λ of ultraviolet radiation are sufficient to obtain a relatively high resolution $R = k_1 (\lambda/NA)$, where $k_1$ is an empirical constant depending on certain process parameters. For example, resolutions R<100 nm may be required for critical layers.

Projection objectives optimized for high resolution typically employ operating wavelengths λ<260 nm, e.g. λ=248 nm or λ=193 nm. Since there are only few materials sufficiently transparent in that wave-length region (e.g. synthetic quartz glass (fused silica) and crystalline fluorides, such as calcium fluoride) and the Abbe numbers of those materials are close together, the correction for chromatic aberrations (color-correction) becomes difficult.

Further, as the available transparent material with sufficient optical quality are in tight supply, material conserving designs are desirable.

In optical lithography, high resolution and good correction status have to be obtained for a relatively large, virtually planar effective image field. Providing a flat image requires lens elements with opposing lens powers. That leads to stronger lens elements, more system length, larger system glass mass, and larger high-order image aberrations that result from the stronger lens curvatures. Effective means for flattening the image field, i.e. for correcting the Petzval sum in projection objectives for microlithography are therefore needed.

Concave mirrors have been used for some time to help solve problems of color correction and image flattening. A concave mirror has positive power, like a positive lens, but the opposite sign of Petzval curvature. Also, concave mirrors do not introduce color problems. Therefore, catadioptric systems that combine refracting and reflecting elements, particularly lenses and one or more concave mirrors, are primarily employed for configuring high-resolution projection objectives of the aforementioned type.

The resolution which can be obtained in an imaging process is only one of a large number of criteria to be observed in an projection exposure process. Often it is desired to improve productivity of a manufacturing processes involving the projection objective. Specifically, it may be desired for economical reasons to maximize the number of substrates which can be exposed in a given time interval, e.g. to maximize the throughput of the projection exposure process.

The article "Optical Lithography—Thirty years and three orders of magnitude" by J. H. Bruning, SPIE vol. 3049, pages 14 to 27, describes the evolution of optical lithography tools in view of conflicting requirements regarding the resolution to be obtained and the rapid increase of substrate size to be exposed in the field of manufacturing integrated circuits. The author describes that industry moved from contact printing to projection printing in the early 1970's as the complexity of integrated circuits increased and defects became critical. After a time where full wafers where printed at 1:1 magnification, the rapid increase in wafer size was accommodated by annular field scanning using 1:1 imaging mirror systems. Further decreased linewidths requirements and overlay budgets forced the introduction of reduction "step-and-repeat" printing of small blocks of chips in the late 1970's. Further demands for smaller linewidths and larger chips have driven optical lithography to shorter wavelength and to scanning the chip in a "step-and-scan" printing mode. In both processes reduction projection objective have been used, starting with reduction ratios of 10:1 in the mid-1970's and tending to nowadays reduction ratios of 5:1 or 4:1.

Projection objectives for a step-and-repeat process, often denoted as "stepper lens" or "stepper objective", are typically designed for a quadratic or a low aspect ratio rectangular effective image field. A popular all-refractive (dioptric) projection objective for a step-and-repeat process was designed for a 22 mm×27.4 mm effective image field centered around the optical axis and NA=0.60. Under these conditions, the circular area on the image side for which the projection objective must be sufficiently corrected has a diameter of about 35.1 mm corresponding to a maximum image field height Y' of about 17.6 mm.

Scanning systems for a reduction step-and-scan process have been developed for cases where the maximum size of the effective image field is not sufficient to cover the desired size of the area to be exposed on the substrate, e.g. the area of the chip on a wafer. Using a slit-shaped effective image field having a high aspect ratio between the widths (perpendicular to the scanning direction) and the height (in scanning direction) allows to expose larger areas on the substrate by successively exposing adjacent areas on the substrate while the mask and the substrate are moved relatively to each other in a scanning direction.

A popular all-refractive projection objective for a scanner-system was designed for a 26 mm×12 mm effective image field (effective image field diameter ca. 29 mm, maximum image field height ca. 14.5 mm) and an image-side numerical aperture NA=0.65. Due to the slit-shaped effective image field the maximum image field height Y' for which the projection objective must be corrected is smaller than that needed for a low aspect ratio rectangular or a quadratic effective image field having the same width.

SUMMARY OF THE INVENTION

It is an object of the invention to provide a compact reduction projection objective that can be built with relatively small amounts of transparent optical material and allows a high throughput of exposed substrates. It is another object to provide compact large-field projection reduction objectives having moderate size.

As a solution to these and other objects, the invention, according to one formulation, provides a reduction projection objective for projection lithography comprising:
a plurality of optical elements arranged along an optical axis and designed for imaging an effective object field arranged in an object surface of the projection objective into an effective image field arranged in an image surface of the projection objective at a reducing magnification ratio $|\beta|$, where $0.25 \leq |\beta| < 1$;
the optical elements being configured to provide an image-side numerical aperture NA>0.6 in an effective image field having a maximum image field height Y'>25 mm;
the optical elements including at least one concave mirror.

According to this aspect of the invention, at least one concave mirror is utilized in connection with transparent lenses to design a catadioptric reduction projection objective providing an effective image field substantially larger than effective image fields of conventional catadioptric projection objectives optimized for ultra high resolution, such as projection objective suitable for immersion lithography at NA>1. Including at least one concave mirror into a projection objective allows to obtain large field projection objectives having compact dimensions in the axial as well as in the radial direction with significant reduction in lens mass when compared to conventional refractive large field projection objectives. Further, providing a magnification ratio $|\beta|$ such that the condition $1 > |\beta| > 0.25$ holds for the magnification ratio $|\beta|$ helps to secure large effective image fields.

Preferably the condition $|\beta| > 0.25$ holds providing a reduction ratio of less than 4:1. Preferably, the magnification ratio is adjusted to be in the range $0.33 \leq |\beta| \leq 0.66$.

Preferred embodiments provide a 2:1 reduction corresponding to $|\beta|=0.5$. Such projection objectives can be adapted to mask sizes similar to the sizes of masks used in conventional 4:1 reduction objectives such that it is possible to utilize conventional reticle stages without modification of their dimensions.

Employing at least one concave mirror allows to significantly reduce the number of transparent lenses necessary to obtain a desired specification with regard to aberrations. In preferred embodiments the condition $N_L < 20$ holds for the number $N_L$ of transparent lenses of the projection objective. More preferably $N_L < 18$ and/or $N_L \leq 16$. Reducing the number of lenses is beneficial for several reasons. Firstly, the total mass of lenses may be reduced significantly when compared to all-refractive (dioptric) systems having comparable image field size and NA. Secondly, as each optical surface within an optical system generates reflection losses, a reduction in a total number of optical surfaces may be beneficial from the transmission point of view to obtain "brighter" projection objectives whereby exposure time can be reduced and, as a consequence, throughput of exposed substrates can be increased.

In some embodiments it has been found useful to provide a relatively large number of aspheric lenses, which can be designed to both reduce the overall number of lenses and to contribute to aberration correction. In preferred embodiments, the projection objective has a number $N_L$ of lenses, a number $N_{ASP}$ of aspheric lenses and the condition AR>0.6 holds for the asphere ratio $AR=N_{ASP}/N_L$. Here an aspheric lens is a lens where at least one of the two lens surfaces is a non-spherical (aspheric) lens surface. Preferably, AR>0.7 and/or $AR \geq 0.8$.

Projection objectives including at least one concave mirror may be designed to have an effective image field (and effective object field) centered around the optical axis (on-axis system). To this end, a physical beam splitter, such as a beam splitter having a polarization selective beam splitter surface, may be used to separate radiation guided to and reflected from a concave mirror. Also, systems having a central pupil obscuration may be used if a centered effective image field is desired.

As systems with physical beam splitter may be difficult to handle in terms of polarization control and since central pupil obscuration may not be desired, alternative catadioptric designs having an effective object field and effective image field arranged outside the optical axis (off-axis systems) may be used. These systems may be subdivided into designs using geometrical beam splitting with one or more planar folding mirrors, and systems without folding mirrors, e.g. so called "in-line systems" having one straight (unfolded) optical axis common to all optical elements. In these off-axis systems, effective fields (object field and image field) positioned entirely outside the optical axis are used to avoid vignetting. Both rectangular effective image fields and effective image fields having an arcuate shape, typically denoted as "annular field" or "ring field" may be used.

One single concave mirror may be sufficient in some embodiments. In other embodiments more than one concave mirror is used. In this case, further degrees of freedom with regard to correction of aberrations are obtained. Preferably, the optical elements include an even number of concave mirrors. In this case, the projection objective may be designed as an in-line system having one straight optical axis common to all optical elements. No planar folding mirrors are necessary, thereby avoiding e.g. polarization effects introduced by planar folding mirrors. Projection objectives having exactly two concave mirrors facing each other may be favorable since a parallel alignment of object surface and image surface and a straight optical axis can be obtained with a minimum number of concave mirrors. Designs with more than two concave mirrors, e.g. three, four, five or six concave mirrors are also possible.

Catadioptric projection objectives designed for imaging the image field directly, e.g. without intermediate image, onto the image surface may be used. Preferred embodiments have at least one (real) intermediate image. Providing at least one intermediate image allows higher flexibility with regard to correction of imaging aberrations, since the correction of aberrations may be obtained by compensating effects of more than one imaging objective part.

Some embodiments include a first, refractive objective part for imaging the pattern provided in the object surface into a first intermediate image; a second objective part including at least one concave mirror for imaging the first intermediate image into a second intermediate image; and a third, refractive objective part for imaging the second intermediate image onto the image surface. The first refractive objective part allows to create the first intermediate image having a desired position, size and corrections status. These parameters can be adjusted such that favorable imaging by the catoptric or catadioptric second objective part into the second intermediate image is possible. The third, refractive objective part may be optimized to compensate residual aberrations of the second intermediate image and to provide the desired image-side numerical aperture NA and effective image field size.

The second objective part may be catoptric (consisting of mirrors only) or catadioptric, combining a concave mirror with at least one lens. For example, one or more negative lenses may be placed in front of a concave mirror situated close to or at the pupil surface of the second objective part to provide a major contribution to color correction. The second objective part may include one concave mirror only. In preferred embodiments, a first concave mirror having a first continuous mirror surface and at least one second concaved mirror having a second continuous mirror surface are arranged in the second objective part. Preferably, pupil surfaces are formed between the object surface and the first intermediate image, between the first and the second intermediate image and between the second intermediate image and the image surface; and all concave mirrors are arranged optically remote from a pupil surface. Ultra-high resolution catadioptric projection objectives of this general construction are disclosed e.g. in US 2005/0190435A1 by the applicant. The disclosure of this document is incorporated herein by reference.

In some embodiments a lens with a maximum diameter $D_{max}$ is arranged in the first objective part, which forms the first intermediate image. In some embodiments the absolute value of the magnification of the first objective part is greater than 1 (first intermediate image larger than effective object field). In these systems lenses of the first objective part arranged near the first intermediate image tend to have large diameters, where the diameters may be the largest lens diameters in the entire projection objective.

Some embodiments are characterized by an extraordinary large effective image field suitable for scanning exposure mode. Specifically, the effective image field may have an aspect ratio AR=B/A between the width B (perpendicular to a scanning direction) and length A in the range from 2:1 to 10:1. The width B may be 50 mm or higher (B≧50mm) and/or the length A may be 2 mm or higher (A≧2 mm).

In some embodiments, no negative lens is present in the first objective part. An axially compact construction is thereby obtained between the object surface and the first intermediate image.

In some embodiments, the first objective part has a region of local minimum of beam diameter at or near the first pupil surface such that a "waist" is formed within the first objective part. A small beam diameter corresponds to a large angle between the chief ray of the imaging process and the optical axis (i.e. chief ray angle). The chief ray angle may exceed 40° and may be, for example, around 45°.

According to another aspect of the invention there is provided a reduction projection objective for projection lithography comprising:
a plurality of optical elements arranged along an optical axis and designed for imaging an effective object field arranged in an object surface of the projection objective into an effective image field arranged in an image surface of the projection objective at a reducing magnification ratio |β|, where 0.33≦|β|≦0.66;

the optical elements being configured to form a first objective part, a dioptric second objective part and a first intermediate image disposed between the first objective part and the dioptric second objective part;
where a size of the first intermediate image is at least twice as large as a size of the effective image field.

As used here, the term "size of the intermediate image" refers to the size of the paraxial intermediate image. Consequently, the magnification ratio is the paraxial magnification ratio given by the ratio of the numerical apertures on either side of an imaging system. For example, if $NA_{IMI}$ is the numerical aperture at the first intermediate image and NA is the image-side numerical aperture, then the magnification ratio of the imaging objective part imaging the first intermediate image onto the image surface (usually the second dioptric objective part) is $NA_{IMI}/NA$. The objective part or parts imaging the first intermediate image onto the image surface are therefore effective as a reducing imaging system having a reducing magnification ratio |β|≦0.5. For example, the magnification ratio of the dioptric second objective part may be smaller than 0.5, e.g. 0.4 or 0.3.

Preferably, the first objective part is a catadiopric objective part including at least one concave mirror. Preferably, no convex mirrors are utilized. It is also possible that the projection objective is a purely refractive projection objective having at least one intermediate image.

Preferably, at least one second intermediate image is formed in addition to the first intermediate image. In those embodiments, at least three imaging objective parts are concatenated along the optical path between object surface and image surface. For example, the projection objective may include, in that sequence, a first objective part for creating first intermediate image, a second objective part for creating a second intermediate image from the first intermediate image, and a third objective part forming the image from the second intermediate image. The first and third objective part may be dioptric (refractive lenses only), whereas the second objective part interposed between the first and third objective part may include at least one concave mirror such that a catoptric or catadioptric second objective part is obtained. The catoptric or catadioptric second objective part may include one or more concave mirrors.

According to another formulation of the invention there is provided a catadioptric projection objective for imaging a pattern provided in an object surface of the projection objective onto an image surface of the projection objective comprising:
a first, refractive objective part for imaging the pattern provided in the object plane into a first intermediate image;
a second objective part including at least one concave mirror for imaging the first intermediate imaging into a second intermediate image;
a third, refractive objective part for imaging the second intermediate imaging onto the image plane; wherein:
the projection objective has a maximum lens diameter $D_{max}$, a maximum image field height Y', and an image side numerical aperture NA>0.6;
wherein $$COMP1=100 \cdot D_{max}/(Y'^2 \cdot NA)$$

and wherein the condition COMP1<37 holds.

Generally, the dimensions of projection objectives having a given size of the effective image field tend to increase dramatically as the image side field radius Y' is increased. Empirically it has been found that the maximum lens diameter $D_{max}$ tends to increase essentially linearly or stronger than linearly with increase of Y' according to $D_{max} \sim Y'^k$, where $k \geq 1$. A value $k=2$ is an approximation used for the purpose of this application. Further, it has been found that the maximum lens diameter $D_{max}$ for large field systems increases in proportion to the image-side numerical aperture NA. A linear dependency is assumed for the purpose of the application. Based on these considerations a first compactness parameter COMP1 is defined as:

$$COMP1 = 100 \cdot D_{max}/(Y'^2 \cdot NA)$$

It is evident that, for given values of maximum image field height $Y'$ (field radius of effective image field) and numerical aperture, the first compactness parameter COMP1 should be as small as possible if a compact design is desired. A value COMP1<37 indicates a very compact design. Even COMP1<35 is possible.

The invention also relates to a projection exposure apparatus comprising:
an illumination system for receiving light from a light source and for forming an illumination field in an exit surface of the illumination system;
a catadioptric projection objective for projecting an image of a pattern arranged in an object surface of the projection objective onto an image surface of the projection objective;
where the object surface of the projection objective coincides with the exit surface of the illumination system and the illumination field of the illumination system defines a size and a shape of an effective object field of the projection objective;
a scanning device for moving the pattern in a scanning direction perpendicular to the optical axis of the projection objective;
the effective object field having a length $A_O$ in the scanning direction and a width $B_O$ perpendicular to the scanning direction such that an aspect ratio $AR=B_O/A_O$ is in the range from 2:1 to 10:1;
the projection objective having a reducing magnification ratio $|\beta|$, where $0.25<|\beta|<1$.

Preferably, $A_O>100$ mm and $B_O>4$ mm.

The absolute values of length $A_O$ and width $B_O$ of the effective object field transform into an effective image field having length A and width B according to $A=|\beta| \cdot A_O$ and $B=|\beta| \cdot B_O$. For example, in a 2:1 reduction system ($|\beta|=0.5$)) $A=\frac{1}{2}A_O$ and $B=\frac{1}{2}B_O$.

In some embodiments the projection objective may be designed such that an off-axis effective object field of the projection objective arranged outside an optical axis of the projection objective is used to obtain an image free of vignetting. Depending on the telecentricity conditions at the interface between illumination system and projection objective in the region of the object surface of the projection objective, the illumination system may be designed to provide an off-axis illumination field outside the optical axis of the illumination system (allowing to arrange the illumination system and projection objective with coinciding optical axes at the interface) or an illumination field centered about the optical axis of the illumination system (such that the optical axes of the illumination system and the projection objective are laterally offset at the interface).

In other embodiments, such as those using a physical beam splitter, the effective object and image fields of the projection objective may be centered about the optical axis. Illumination systems having an illumination field centered about the optical axis of the illumination system may be used in this case such that the optical axes of the illumination system and the projection objective may be coaxial at the object surface of the projection objective.

The invention further relates to a method for fabricating semiconductor devices or other types of micro devices comprising:
providing a mask having a prescribed pattern, where the pattern includes a first pattern area with a first pattern and a second pattern area adjacent to the first pattern area with a second pattern;
illuminating the mask with ultraviolet light having a prescribed wavelength in an illumination field having a width sufficient to cover the first pattern area and the second pattern area;
projecting an image of the pattern including the first and second pattern onto a photosensitive substrate arranged in the vicinity of an image surface of a projection objective;
scanning the mask and the substrate simultaneously by moving the mask and the substrate simultaneously relative to the projection objective in a scanning direction perpendicular to an optical axis of the projection objective,
whereby at least two immediately adjacent images of the first and the second pattern are formed on the substrate synchronically in one scanning operation.

In some embodiments particularly suitable for microlithography the prescribed wavelength lies in a range between 370 nm and 120 nm.

The second pattern may be identical to the first pattern. For example, the first and second pattern may each correspond to a complete structure of a single layer of a semiconductor device in a standard die, such that corresponding complete layers of two semiconductor devices disposed directly adjacent to each other on the wafer may be exposed in one scanning operation. A high throughput of exposed units on a substrate at relatively high resolution can thereby be obtained. This parallel exposure of $N1 \geq 2$ directly adjacent patterns at relatively high resolution may be combined with exposure steps performed at substantially lower resolution, wherein these exposure steps may cover a different number $N2 \neq N1$ of standard patterned areas, for example with $N2>N1$.

The previous and other properties can be seen not only in the claims but also in the description and the drawings, wherein individual characteristics may be used either alone or in sub-combinations as an embodiment of the invention and in other areas and may individually represent advantageous and patentable embodiments.

DETAILED DESCRIPTION OF THE PREFERRED EMBODIMENTS

In the following description of preferred embodiments of the invention, the term "optical axis" shall refer to a straight line or sequence of straight-line segments passing through the centers of curvature of the optical elements. In the case of those examples presented here, the object is either a mask (reticle) bearing the pattern of an integrated circuit or some other pattern, for example, a grating pattern. In the examples presented here, the image of the object is projected onto a wafer serving as a substrate that is coated with a layer of photoresist, although other types of substrate, such as components of liquid-crystal displays or substrates for optical gratings, are also feasible.

The terms "front" and "rear" as well as the terms "upstream" and "downstream" relate to relative positions along the optical path, where "front" and "upstream" relate to positions optically closer to the object surface in a projection objective.

Unless stated otherwise the data given for the image-side numerical aperture NA refer to the maximum image-side numerical aperture allowing a reasonable function of the projection objective, i.e. the maximum NA value for which the projection objective is designed (design NA). In systems having a variable size aperture stop the numerical aperture actually used in a process may be set to values smaller than the design NA as desired, for example to increase the depth of field.

Where tables are provided to disclose the specification of a design shown in a figure, the table or tables are designated by the same numbers as the respective figures.

Figure 1:
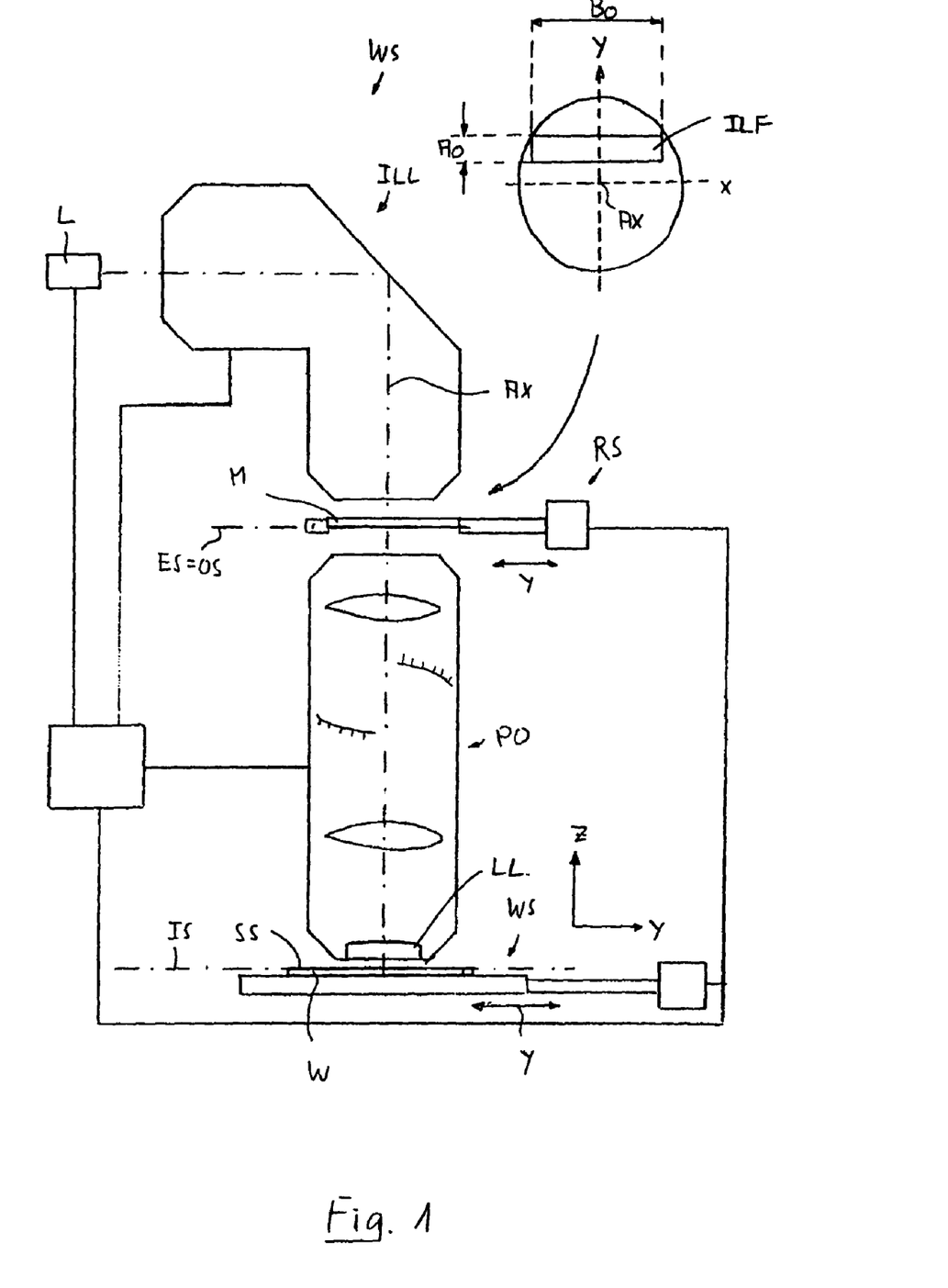
FIG. 1 shows a schematic drawing of a projection exposure apparatus for microlithography having an illumination system designed for creating an off-axis illumination field and a catadioptric projection objective according to an embodiment of the invention.

FIG. 1 shows schematically a microlithographic projection exposure apparatus in the form of a wafer scanner WS, which is provided for fabricating large scale integrated semiconductor components in a step-and-scan mode. The projection exposure apparatus comprises as light source an KrF excimer laser L having an operating wavelength of about 248 nm. Other operating wavelengths are also possible in other embodiments. A downstream illumination system ILL generates, in its exit surface ES, a large, sharply delimited, homogeneously illuminated illumination field ILF that is adapted to the telecentric requirements of the downstream catadioptric projection objective PO. The illumination system ILL has devices for selection of the illumination mode and, in the example, can be changed over between conventional on-axis illumination with a variable degree of coherence, and off-axis illumination, particularly annular illumination (having a ring shaped illuminated area in a pupil surface of the illumination system) and dipole or quadrupole illumination.

Arranged downstream of the illumination system is a device RS (reticle stage) for holding and manipulating a mask M in such a way that a pattern formed on the mask lies in the exit surface ES of the illumination system coinciding with the object surface OS of the projection objective PO and can be moved in this plane for a scanning operation in a scanning direction (Y-direction) perpendicular to the optical axis AX common to the illumination system and the projection objective (i.e. the Z-direction).

The reduction projection objective PO is designed to image an image of a pattern provided by the mask with a reduced scale of 2:1 (magnification ratio $|\beta|=0.5$) onto a wafer W coated with a photoresist layer. The wafer W serving as a light-sensitive substrate is arranged in such a way that the planar substrate surface SS with the photoresist layer essentially coincides with the planar image surface IS of the project objective. The wafer is held by a device WS (wafer stage) comprising a scanner drive in order to move the wafer synchronously with the mask M in parallel with the latter. The device WS also comprises manipulators in order to move the wafer both in the Z direction parallel to the optical axis OA and in the X and Y directions perpendicular to said axis. A tilting device having at least one tilting axis running perpendicular to the optical axis is integrated.

The projection objective PO has a flat, planoconvex last lens LL as the last optical element nearest to the image surface IS, the planar exit surface of said last lens being the last optical surface (exit surface) of the projection objective PO. During operation of the projection exposure apparatus, a gas filled gap is formed between the exit surface of the last optical element and the substrate surface SS.

As shown schematically in the inset figure of FIG. 1, the illumination system ILL is capable of generating an illumination field ILF having a rectangular shape. The position, size and shape of the illumination field determine the position, size and shape of the effective object field OF and the effective image field IF of the projection objective actually used in the projection process. The effective object field OF has a height $A_O$ parallel to the scanning direction (Y-direction) and a width $B_O$ perpendicular to the scanning direction and an aspect ratio $AR=B_O/A_O$ of about 104:22.

In the embodiment, the optical axes of the illumination system and the projection objective coincide at the interface defined by the exit surface ES of the illumination system coinciding with the object surface OS of the projection objective. The illumination field IF formed by the illumination system does not include the optical axis of the illumination system (off-axis illumination field). In other embodiments, the illumination system is designed to form an illumination field centered about the optical axis of the illumination system and the optical axis of the illumination system is laterally offset relative to the optical axis of the projection objective to such an extent that the illumination field lies at the appropriate position outside the optical axis of the projection objective required to obtain the imaging without vignetting.

Figure 2:
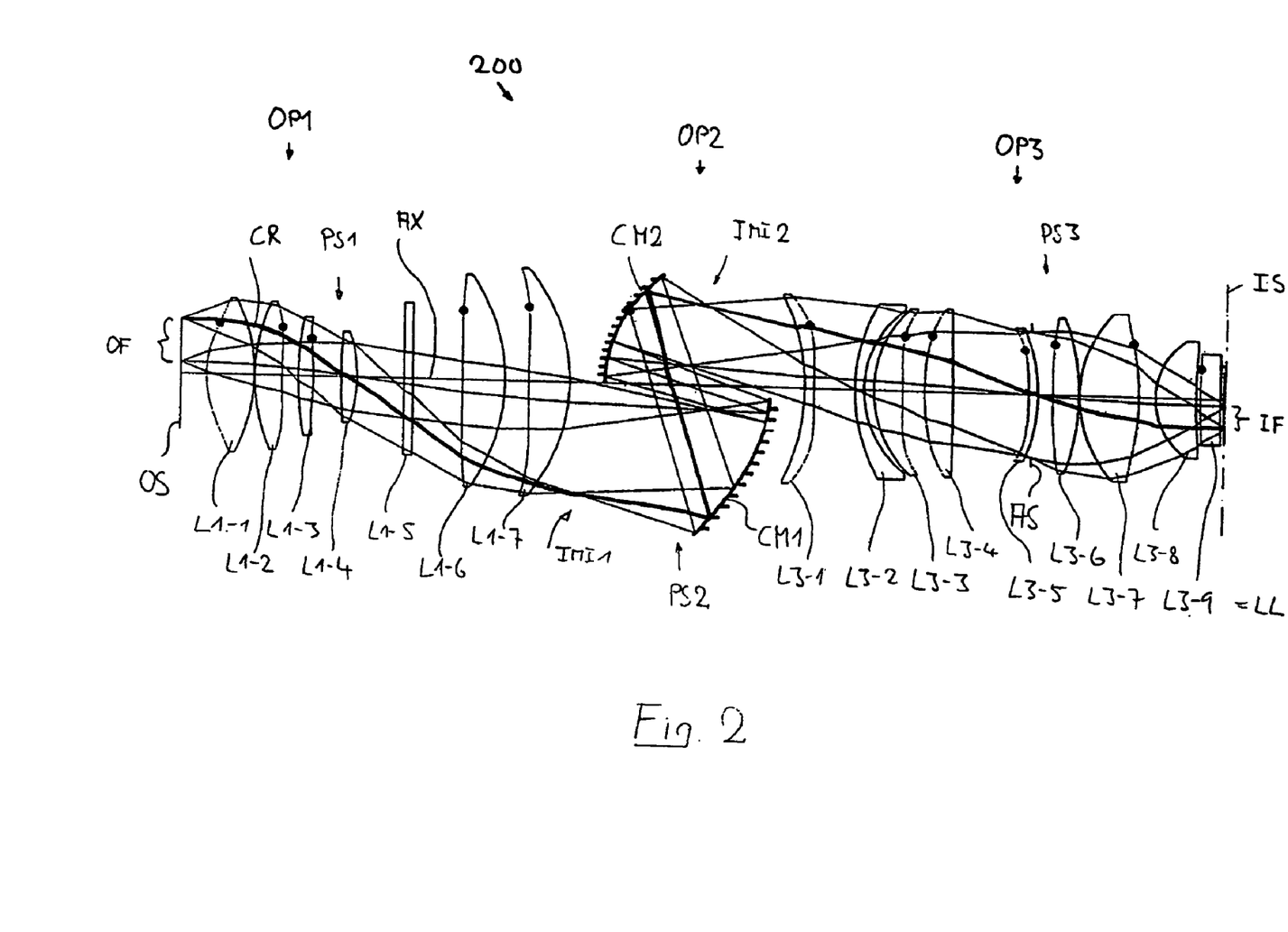
FIG. 2 shows an meridional lens section of a preferred embodiment of a catadioptric reduction projection objective according to the invention.

FIG. 2 shows an embodiment of a catadioptric projection objective 200 according to the invention designed for ca. 248 nm UV working wavelength. It is designed to project an image of a pattern on a reticle (mask) arranged in the planar object surface OS (object plane) into the planar image surface IS (image plane) on a reduced scale 2:1, while creating exactly two real intermediate images IMI1, IMI2. A first refractive objective part OP1 is designed for imaging the pattern in the object surface into the first intermediate image IMI1 at an enlarged scale with $1.5<|\beta_1|<2.5$. Therefore, the first intermediate image is larger than the effective object field, e.g. approximately twice as large. A second, catoptric (purely reflective) objective part OP2 images the first intermediate image IMI1 into the second intermediate image IMI2 at a slightly demagnifying magnification with $0.5<|\beta|<1$. The second intermediate image may therefore be larger than the effective object field, which is the case in the embodiment. A third, refractive objective part OP3 images the second intermediate image IMI2 onto the image surface IS with a reduction ratio of about $|\beta|_3=0.3$. The size of the second intermediate image is therefore significantly larger than twice the size of the effective image field. An aperture stop AS is placed in the third objective part in the region of the pupil surface PS3 thereof. In other embodiments, the aperture stop may be positioned in the first objective part at or near the pupil surface P1 thereof.

An off-axis effective object field OF positioned outside the optical axis AX is projected on an off-axis image field IF. The trajectory of a chief ray CR of an outer field point of the off-axis object field OF in the meridional plane (drawing plane) is drawn bold in order to facilitate following the beam path. For the purpose of this application, the term "chief ray" (also known as principal ray) denotes a ray emanating from a field point away from the optical axis of the effectively used object field OF and intersecting the optical axis at at least one pupil surface position. Here, three pupil surfaces PS1, PS2 and PS3 are formed, one pupil surface in each objective part. In projection objectives being essentially telecentric on the object side (as in the embodiment), the chief ray emanates from the object surface parallel or at a very small angle with respect to the optical axis. As evident from the figure, the chief ray intersects both the object surface and the image surface essentially at right angles indicating both object-side and image-side telecentricity. The imaging process is further characterized by the trajectory of marginal rays. A "marginal ray" as used herein is a ray running from an axial object field point (on the optical axis) to the edge of an aperture stop AS. That marginal ray may not contribute to image formation because an off-axis effective object field is used to avoid vignetting. The chief ray and marginal ray are chosen to characterize optical properties of the projection objective.

The first, refractive objective part OP1 includes, in this order starting from the object surface, a biconvex positive lens L1-1 having an aspherical entry surface and a spherical exit surface, a biconvex positive lens L1-2 having a spherical entry surface and an aspherical exit surface, a thin positive lens L1-3 having a spherical entry surface and an aspherical exit surface having concave surface portions around the optical axis and convex surface portions near the outer edge of the lens, a biconvex, bispherical positive lens L1-4, a plane parallel plate L1-5, a biconvex positive lens L1-6 having an aspherical entry surface and a spherical exit surface, and a positive lens L1-7 having an aspherical entry surface and a spherical exit surface. There is no negative lens in the first objective part OP1 such that overall positive power is distributed in a compact refractive imaging subsystem. Positive lens L1-7 immediately upstream of the first intermediate image IMI1 is the lens with the largest optically used diameter $D_{max}$ in the entire projection objective.

The second objective part OP2 comprises a first concave mirror CM1 having the concave mirror surface facing the object side, and a second concave mirror CM2 having the concave mirror surface facing the image side. The aspherically curved mirror surfaces are both continuous or unbroken, i.e. they do not have a hole or bore. The mirror surfaces facing each other define a catadioptric cavity, which is also denoted intermirror space, enclosed by the curved surfaces defined by the concave mirrors. The intermediate images IMI1, IMI2 (at least the paraxial parts thereof) are both situated inside the catadioptric cavity well apart from the mirror surfaces.

Each mirror surface of a concave mirror defines a "curvature surface" or "surface of curvature" which is a mathematical surface extending beyond the edges of the physical mirror surface and containing the mirror surface. The first and second concave mirrors are parts of rotationally symmetric curvature surfaces having a common axis of rotational symmetry coinciding with the optical axis defined by the first and third objective parts (in-line system).

The third, refractive objective part OP3 has, in this order between the second intermediate image IMI2 and the image surface IS, a positive meniscus lens L3-1 having a concave spherical entry surface and an aspherical exit surface with a large variation of local radius of curvature between an almost planar area around the optical axis and the outer edge of the lens, a bispherical negative meniscus lens L3-2 having a concave exit surface facing the image surface, a positive meniscus lens L3-3 having a spherical entry surface and a concave, aspherical exit surface, a biconvex positive lens L3-4 having an aspherical entry surface and a spherical exit surface with large radius, a thin positive meniscus lens L3-5 having an aspherical concave entry surface and a spherical exit surface close to the third pupil surface PS3, a biconvex positive lens L3-6 having an aspherical entry surface and a spherical exit surface, a biconvex positive lens L3-7 having a spherical entry surface and an aspherical exit surface, a positive meniscus lens L3-8 having a spherical entry surface and a spherical, slightly concave exit surface, and last lens LL designed as a piano convex positive lens L3-9 having an aspherical entry surface with large base radius, and a planar exit surface arranged at an image-side working distance of about 3.6 mm from the image surface IS.

The objective 200 is rotational symmetric and has one straight optical axis AX common to all refractive and reflective optical components. There are no folding mirrors. The concave mirrors have small diameters allowing to bring them close together and rather close to the intermediate images lying in between. The concave mirrors are both constructed and illuminated as off-axis sections of axial symmetric surfaces. The light beam passes by the edges of the concave mirrors facing the optical axis without vignetting. The exit pupil is circular without obscuration and is centered about the optical axis.

The projection objective 200 is designed as a "dry objective" for $\lambda$=248 nm having a maximum image side numerical aperture NA=0.75 in an off-axis effective image field with height A=11 mm and width B=52 mm. The total track length (axial distance between object surface and image surface) is 1.141 mm. The maximum used lens diameter is about $D_{MAX}$=253 mm. The maximum image height is about Y'=31.4 mm. The moderate dimensions of the design in radial direction are characterized by the first compactness parameter COMP1=34.2, where COMP1=100·$D_{max}$/(Y'$^2$·NA). The optical correction for aberrations is characterized by a root-mean-square (RMS) of the wavefront error equal to a smaller than 13 m$\lambda$ for all image heights. There are only 16 lenses. All lenses are made of fused silica. Typical resolutions of R$\leq$120 nm can be obtained.

The specification for this design is summarized in Table 2. The leftmost column lists the number of the refractive, reflective, or otherwise designated surface, the second column lists the radius, r, of that surface [mm], the third column lists the distance, d [mm], between that surface and the next surface, a parameter that is referred to as the "thickness" of the optical element, the fourth column lists the refractive index of the material employed for fabricating that optical element, and the fifth column lists the optically utilizable, clear, semi diameter [mm] of the optical component. A radius r=0 in a table designates a planar surface (having infinite radius).

In this embodiment, 14 surfaces (marked by dots in FIG. 2) are aspherical surfaces. Table 2A lists the associated data for those aspherical surfaces, from which the sagitta or rising height p(h) of their surface figures as a function of the height h may be computed employing the following equation:

$$p(h)=[((1/r)h^2)/(1+\text{SQRT}(1-(1+K)(1/r)^2h^2))]+C1\cdot h^4+C2\cdot h^6+\ldots,$$

where the reciprocal value (1/r) of the radius is the curvature of the surface in question at the surface vertex and h is the distance of a point thereon from the optical axis. The sagitta or rising height p(h) thus represents the distance of that point from the vertex of the surface in question, measured along the z-direction, i.e., along the optical axis. The constants K, C1, C2, etc., are listed in Table 2A.

The structural features described above enable the projection objective 200 to be used as a large field scanner objective in wafer scanners optimized for sub-critical layers or mid-critical layers in mass production.

Utilizing a catadioptric design (including lenses and at least one concave mirror) allows to significantly reduce the mass of transparent optical material necessary to form the lenses of the projection objective. In this respect it is to be noted that, unlike in projection objectives optimized for ultra high image-side numerical apertures, the lens diameters within the third objective part OP3 are significantly smaller than the maximum lens diameter, which is found in the last lens L1-7 of the first objective part OP1. Further, there are only 15 lenses providing optical power, in addition to one plane parallel plate L1-5. By reducing the number and size of lenses, significant savings with regard to material and manufacturing costs and a high transmission are obtained. In addition to the compact dimensions in radial direction (determined here by the radial dimensions of the concave mirrors CM1 and CM2), the projection objective is axially compact (track length only about 1.150 mm) allowing to incorporate the projection objective in existing mechanical environments of wafer scanners with only slight modifications.

Figure 3:
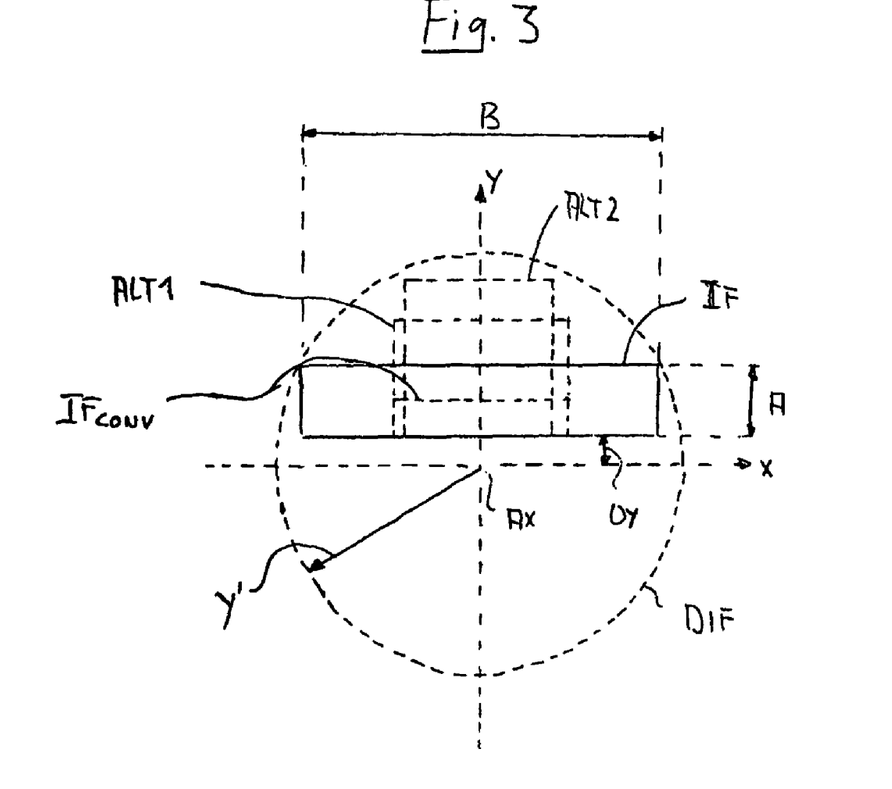
FIG. 3 illustrates schematically the relation between the size of the design image field of the projection objective and the size, shape and position of off-axis effective image fields which can be used within the design image field.
Figure 4:
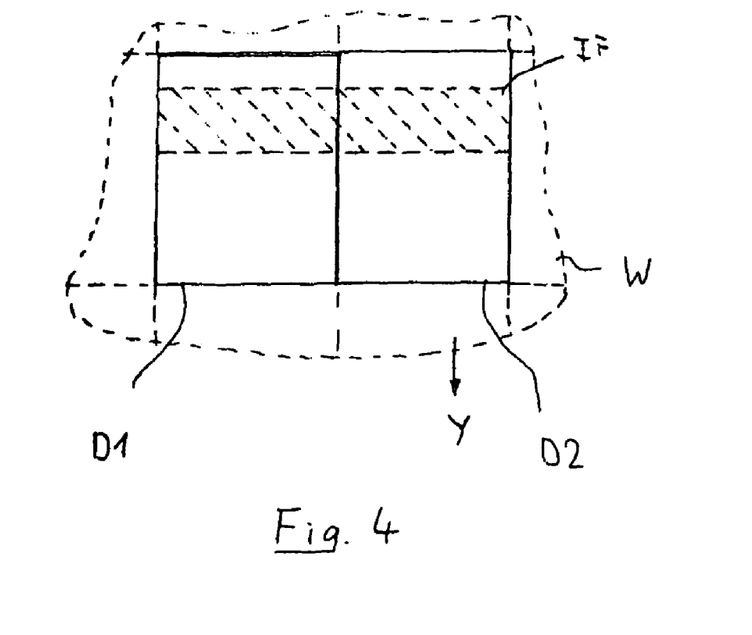
FIG. 4 illustrates a synchronous scanning operation of two immediately adjacent dies on a wafer.

Some optical characteristics enabling high throughput mass production of exposed substrates are now explained in connection with FIGS. 3 and 4. FIG. 3 illustrates schematically the relation between the size of the design image field DIF of the projection objective and the size, shape and position of off-axis effective image field which can be used within the design image field.

The design image field DIF is a circular area of minimum radius Y' concentric with the optical axis AX enclosing the effective image field IF. The design image field includes all field points of the image surface which can be projected by the projection objective with an imaging fidelity sufficient for the intended lithographic process. With other words: within zones having radial coordinates smaller than Y' all imaging aberrations are corrected sufficiently for the intended projection purpose, whereas one or more aberrations are higher than a desired threshold value for field points outside of the design image field. Depending on the shape and position of the effective image field all field points of the design image field, including field points on and close to the optical axis, may need to be sufficiently corrected. In projection objectives designed for off-axis effective image fields, particularly those having an arcuate shape, it may be possible that the field points having sufficient correction status form a ring zone around the optical axis (including the effective image field), whereas the region on and around the optical axis may not need to be sufficiently corrected. The size of the design image field is characterized by the design image field radius, Y', also denoted here as "maximum image field height". As correction of a projection objective becomes easier, and smaller dimensions are possible, the smaller the design image field radius is, it is generally desirable to minimize the design image field radius.

On the other hand, in order to obtain an efficient projection process, e.g. for manufacturing microstructured semiconductor devices, it is desirable to have a sufficiently large size of the effectively used image field IF. In most projection exposure systems designed for a scanning operation a slit-shaped image field IF is used and the pattern to be imaged as well as the substrate to be exposed are synchronously moved in a scanning direction Y during a projecting step. In the embodiment described here, a rectangular effective image field IF having a height A parallel to the scanning direction Y and a width B perpendicular to the scanning direction is used.

In the embodiment, the slit-shaped rectangular off-axis image field IF has the height A=11 mm and a width B=52 mm, corresponding to an aspect ratio B/A=4.72. The effective image field IF is radially offset with respect to the optical axis AX by an offset distance OY of 7 mm between the inner edge of the effective image field (facing the optical axis) and the optical axis in scanning direction. The outer edge of the effective image field coincides with the perimeter of the design image field DIF. The radius of the design image field DIF (corresponding to the maximum image height Y') is about Y'=31.4 mm.

In order to visualize the dramatic size difference between a large effective image field according to this embodiment of the invention and effective image fields of conventional catadioptric projection objectives optimized for highest resolution, FIG. 3 also shows, at the same scale, a 26 mm×5.5 mm effective image field $IF_{CONV}$ of a conventional catadioptric projection objective for immersion lithography at NA=1.2 in dashed lines. Also, alternative effective image field shapes ALT1 and ALT2 which can be accommodated in the design image field DIF of the embodiment are shown. Alternative ALT1 corresponds to a 26 mm×17 mm rectangular effective image field, whereas alternative ALT2 corresponds to a quadratic 22 mm×22 mm effective image field. Both alternatives do not entirely tap the full optical potential of the large design image field.

Presently it is customary in the field of manufacturing integrated circuits and the like to use standardized sizes of dies, e.g. die size of 26 mm×33 mm or 25 mm×33 mm. Consequently, a projection objective having e.g. a 26 mm×33 mm rectangular effective image field could be used to expose an entire standard die in one exposure step without scanning. Also, a narrow scanner effective image field having 26 mm field width allows to scan such standard die.

In contrast, the extremely wide effective image field IF according to the embodiment allows to expose two immediately adjacent standard dies, each being 26 mm wide, synchronically in one scanning operation. This is schematically illustrated in FIG. 4, which shows a plan view of the substrate surface of a wafer W including a large number of rectangular 26 mm×33 mm dies immediately adjacent to each other. Two dies D1 and D2 touching along their long sides are shown. The width B=52 mm of the effective image field IF of the embodiment allows to cover the narrow sides of both adjacent dies D1 and D2 simultaneously. As the wafer is moved relative to the projection objective in the scanning direction (Y-direction) the two dies D1 and D2 are simultaneously exposed in one scanning operation. It is evident that a significant improvement in productivity of chip production may be obtained this way.

Further contributions to obtaining a high throughput of exposed substrates originates from the relatively low reduction ratio of the projection objective, which is 2:1 reduction ratio ($|\beta|$=0.5) in this embodiment. This is explained by comparison with a conventional projection objective having 4:1 reduction ratio ($|\beta|$=0.25). Assuming, for the conventional scanning system, that the slit-shaped illumination field illuminating the mask has a size $B_O$=104 mm and $A_O$=22 mm. The scanning speed (speed of movement in scanning direction Y perpendicular to the optical axis) may be v(R). With a reduction ratio 4:1 these values correspond to an image field size B=26mm and A=5.5mm and a scanning speed at the wafer, v(W), with: v(W)=v(R)/4. Now consider modifying the magnification ratio of the projection objective without modifying the size of the illumination field and the scanning speed at the mask. For the exemplary embodiment, the magnification ratio is modified to obtain a 2:1 reduction ($|\beta|$=0.5). By doing so the size of the effective image field increases by a factor of 2 such that B=52 mm and A=11 mm (the size of the illumination field still being $B_O$=104 mm and $A_O$=22 mm). At the same time the change of magnification ratio also requires a different scanning speed at the substrate, namely v(W)=v(R):2. With other words: the change in magnification ratio from 4:1 to 2:1 increases both the size of the effective image field and the scanning speed of the substrate each by a factor of 2. As a consequence, the number of unit areas which can be exposed in a given time unit is increased fourfold (by a factor of 4) simply by modifying the reduction ratio of the projection objective without the need to modify the mechanical construction at the reticle stage and control of the movements thereof.

In view of the practical implementation into a projection exposure apparatus, the preferred embodiment has some properties similar to corresponding properties of conventional refractive projection objectives, whereby a change over between refractive systems and catadioptric systems is greatly facilitated. Firstly, the embodiment has one straight (unfolded) optical axis. Further, an effective object field disposed on one side of the optical axis may be imaged into an effective image field disposed on the opposite side of the optical axis, i.e. the imaging is performed with "negative magnification", corresponding to a negative value of parameter β. Thirdly, the objective can be designed to have isotropic magnification. Here, the term "isotropic magnification" refers to an image formation without "image flip", i.e. without a change of chirality between object field and image field. With other words, features on the reticle described in a right handed coordinate system can be described in a similar right handed coordinate system in the image. The negative isotropic magnification is present in both x- and y-directions perpendicular to the optical axis. This allows to use the same type of reticles also used for imaging with refractive projection objectives. These features facilitate implementation of this particular type of catadioptric projection objective in conventional exposure apparatus designed for refractive projection objectives since no major reconstructions are required, for example, at the reticle- and wafer-stages. Also, reticles designed for use with refractive projection objectives can in principle also be used with such catadioptric projection objectives. Considerable cost savings for the end user can be obtained this way.

The invention is not limited to the embodiments described so far. For example, other operating wavelengths, such as 157 nm, 193 nm, 351 nm (XeF-Laser) or 365 nm (i-Line of Hg-lamp) are also possible in other embodiments. One or more diffractive optical surface may be used in the projection objective and/or in the illumination system, e.g. to provide a desired dispersion for color correction. In a projection exposure apparatus using a laser with bandwidth narrowing devices only one material may be used for all the lens elements. In a projection exposure apparatus with broadband light source (e.g. i-Line-lamp, laser diode, laser without bandwidth narrowing devices) specific means for improving color correction may be used. These means may include one of using at least two lens materials with different dispersion at exposure wavelength, and using at least one diffractive optical elements (DOE) within the projection objective.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The content of all the claims is made part of this description by reference.

TABLE 2

NA = 0.75; effective image field: A = 11 mm; B = 52 mm; λ = 248,413 nm

| SURFACE | RADIUS | THICKNESS | INDEX | SEMI-DIAMETER |
|---|---|---|---|---|
| 0 | 0.000000 | 27.704600 | 1.00028790 | 62.800 |
| 1 | 114.222351 | 52.147223 | 1.50885281 | 84.064 |
| 2 | −205.126200 | 0.676261 | 1.00028733 | 84.836 |
| 3 | 212.775931 | 29.530059 | 1.50885281 | 81.297 |
| 4 | 637.959587 | 17.758837 | 1.00028733 | 79.517 |
| 5 | 348.435932 | 16.333068 | 1.50885281 | 64.359 |
| 6 | −287.803989 | 30.117157 | 1.00028733 | 60.765 |
| 7 | 633.653338 | 17.727417 | 1.50885281 | 44.243 |
| 8 | −165.718403 | 50.649953 | 1.00028733 | 48.400 |
| 9 | 0.000000 | 9.958621 | 1.50885281 | 80.449 |
| 10 | 0.000000 | 54.367084 | 1.00028733 | 83.827 |
| 11 | −3406.675197 | 46.902725 | 1.50885281 | 115.244 |
| 12 | −212.884619 | 26.154121 | 1.00028733 | 117.865 |
| 13 | 1668.924890 | 44.204696 | 1.50885281 | 124.524 |
| 14 | −207.071157 | 220.244347 | 1.00028733 | 126.423 |
| 15 | −168.396021 | −182.242700 | 1.00028733 | 164.726 |
| 16 | 148.485125 | 220.253684 | 1.00028733 | 123.015 |
| 17 | −237.472077 | 9.982870 | 1.50885281 | 102.674 |
| 18 | 1109.562493 | 45.178879 | 1.00028733 | 104.695 |
| 19 | 203.758384 | 9.889061 | 1.50885281 | 96.432 |
| 20 | 117.714718 | 10.795233 | 1.00028733 | 90.032 |
| 21 | 131.029297 | 31.925193 | 1.50885281 | 91.701 |
| 22 | −1060.979977 | 24.070090 | 1.00028733 | 90.175 |
| 23 | 347.260264 | 30.734367 | 1.50885281 | 92.461 |
| 24 | −4005.086163 | 82.154927 | 1.00028733 | 90.945 |
| 25 | −499.484115 | 10.085641 | 1.50885281 | 71.757 |
| 26 | −188.537049 | −7.571929 | 1.00028733 | 72.079 |
| 27 | 0.000000 | 0.000000 | 1.00028733 | 70.981 |
| 28 | 0.000000 | 23.816528 | 1.00028733 | 70.981 |
| 29 | 3699.703627 | 28.810878 | 1.50885281 | 83.360 |
| 30 | −254.379475 | 0.913521 | 1.00028733 | 85.200 |
| 31 | 142.549133 | 64.898911 | 1.50885281 | 91.599 |
| 32 | −243.641082 | 18.255385 | 1.00028733 | 87.898 |
| 33 | 82.513648 | 44.426218 | 1.50885281 | 63.019 |
| 34 | 883.183901 | 4.413125 | 1.00028733 | 52.480 |
| 35 | 488.676603 | 22.500636 | 1.50885281 | 47.814 |
| 36 | 0.000000 | 3.628893 | 1.00000000 | 35.522 |
| 37 | 0.000000 | 0.000000 | 1.00000000 | 31.400 |

TABLE 2 A

Aspheric coefficients

| SRF | 1 | 4 | 6 | 11 | 13 |
|---|---|---|---|---|---|
| K | 0 | 0 | 0 | 0 | 0 |
| C1 | −1.463802e−07 | −2.697748e−07 | 2.676250e−07 | 3.411355e−08 | −4.844682e−08 |
| C2 | −1.174724e−11 | 1.709963e−11 | 1.420781e−11 | −1.912531e−12 | 4.506047e−13 |
| C3 | −1.797637e−15 | −5.505302e−15 | 9.659197e−15 | 1.995219e−16 | −4.615738e−17 |
| C4 | 6.910975e−19 | −5.064193e−19 | −2.696105e−18 | −1.651529e−20 | 1.290582e−21 |
| C5 | −1.627798e−22 | 5.583791e−22 | 6.632957e−22 | 1.152132e−24 | −5.714006e−26 |
| C6 | 2.418488e−26 | −1.041831e−25 | −1.983883e−25 | −6.184649e−29 | −2.272436e−30 |
| C7 | −1.938381e−30 | 8.339760e−30 | 3.130871e−29 | 2.047029e−33 | 2.006956e−34 |

TABLE 2 A-continued

Aspheric coefficients

| | | | | | |
|---|---|---|---|---|---|
| C8 | 6.399704e−35 | −2.538359e−34 | −1.783535e−33 | −3.107557e−38 | −7.046046e−39 |
| C9 | 0.000000e+00 | 0.000000e+00 | 0.000000e+00 | 0.000000e+00 | 0.000000e+00 |

| SRF | 15 | 16 | 18 | 22 | 23 |
|---|---|---|---|---|---|
| K | −1.8958 | −1.9651 | 0 | 0 | 0 |
| C1 | −2.055729e−08 | 6.662767e−08 | −3.365667e−07 | 2.951292e−07 | 1.195042e−07 |
| C2 | 3.336302e−13 | −2.610965e−13 | 8.757337e−12 | −5.141860e−12 | −7.917642e−12 |
| C3 | −1.121427e−17 | 3.516338e−17 | 5.450117e−16 | 9.068717e−16 | 1.640794e−15 |
| C4 | 3.590821e−22 | −2.595066e−22 | −1.054858e−19 | −1.077893e−19 | −1.832802e−19 |
| C5 | −1.254099e−26 | 1.453852e−26 | 6.926384e−24 | 8.154234e−24 | 1.800551e−23 |
| C6 | 3.456147e−31 | 1.605442e−30 | −1.633995e−28 | −4.394704e−28 | −1.296471e−27 |
| C7 | −5.867989e−36 | −9.070137e−35 | −6.121101e−33 | 2.618886e−32 | 5.926707e−32 |
| C8 | 4.265112e−41 | 3.626042e−39 | 3.354039e−37 | −2.945729e−36 | −1.438874e−36 |
| C9 | 0.000000e+00 | 0.000000e+00 | 0.000000e+00 | 0.000000e+00 | 0.000000e+00 |

| SRF | 25 | 29 | 32 | 35 |
|---|---|---|---|---|
| K | 0 | 0 | 0 | 0 |
| C1 | −3.308765e−07 | 1.653774e−07 | 5.813777e−08 | −1.203593e−07 |
| C2 | 8.782079e−12 | −1.207111e−11 | 3.197010e−12 | −6.792360e−11 |
| C3 | 6.371967e−16 | −1.224392e−15 | −2.120719e−16 | −7.444605e−15 |
| C4 | −2.927106e−19 | 4.029118e−19 | 1.449945e−20 | 1.072880e−17 |
| C5 | 7.813085e−24 | −4.366979e−23 | −2.565162e−24 | −2.729102e−21 |
| C6 | 3.634790e−27 | 2.102722e−27 | 2.292604e−28 | 2.551991e−25 |
| C7 | −6.001201e−31 | −1.334478e−32 | −1.012346e−32 | 0.000000e+00 |
| C8 | 2.839937e−35 | −1.902548e−36 | 2.020907e−37 | 0.000000e+00 |
| C9 | 0.000000e+00 | 0.000000e+00 | 0.000000e+00 | 0.000000e+00 |

What is claimed is:

1. A reduction projection objective for projection lithography comprising:
a plurality of optical elements arranged along an optical axis and designed for imaging an effective object field arranged in an object surface of the projection objective into an effective image field arranged in an image surface of the projection objective at a reducing magnification ratio $|\beta|$, where $1 > |\beta| \geq 0.25$;
the optical elements being configured to provide an image-side numerical aperture NA>0.6 in an effective image field having a maximum image field height Y'>25 mm;
the optical elements including at least one concave mirror.

2. Projection objective according to claim 1, wherein $|\beta| > 0.25$.

3. Projection objective according to claim 2, wherein $|\beta| = 0.5$.

4. Projection objective according to claim 1, wherein the condition $N_L < 20$ holds for the total number $N_L$ of lenses of the projection objective.

5. Projection objective according to claim 4, wherein $N_L \leq 16$.

6. Projection objective according to claim 1, wherein the effective image field has an aspect ratio AR=B/A between width B and length A and wherein the aspect ratio is in a range from 2:1 to 10:1.

7. Projection objective according to claim 1, wherein the effective image field has a width B>50 mm and length A>2 mm.

8. Projection objective according to claim 1, wherein the projection objective has an even number of concave mirrors.

9. Projection objective according to claim 8, wherein the even number is two.

10. Projection objective according to claim 1, wherein the projection objective is an in-line system having one straight optical axis common to all optical elements.

11. Projection objective according to claim 1, wherein the projection objective has at least one intermediate image.

12. Projection objective according to claim 1, wherein the projection objective is designed to form a circular exit pupil without obscuration and centered about the optical axis.

13. Projection objective according to claim 1, wherein $0.66 \geq |\beta| 0.33$.

14. Projection objective according to claim 1, wherein the projection objective comprises:
a first, refractive objective part for imaging a pattern provided in the object surface into a first intermediate image;
a second objective part including at least one concave mirror for imaging the first intermediate imaging into a second intermediate image;
a third, refractive objective part for imaging the second intermediate imaging onto the image surface.

15. Projection objective according to claim 14, wherein a first concave mirror having a first continuous mirror surface and at least one second concave mirror having a second continuous mirror surface are arranged in the second objective part;
pupil surfaces are formed between the object surface and the first intermediate image, between the first and the second intermediate image and between the second intermediate image and the image surface; and
all concave mirrors are arranged optically remote from a pupil surface.

16. Projection objective according to claim 14, wherein the first objective part and the second objective part and the third objective part share a common straight optical axis.

17. Projection objective according to claim 14, wherein the first objective part includes the lens with maximum diameter $D_{max}$ of the projection objective.

18. Projection objective according to claim 14, wherein the first objective part includes no lens with negative refractive power.

19. Projection objective according to claim 14, wherein the projection objective is designed to image an off-axis effective object field arranged entirely outside the optical axis into an off-axis image field arranged entirely outside the optical axis.

20. A catadioptric projection objective for imaging a pattern provided in an object surface of the projection objective onto an image surface of the projection objective comprising:
   a first, refractive objective part for imaging the pattern provided in the object surface into a first intermediate image;
   a second objective part for imaging the first intermediate image into a second intermediate image;
   a third, refractive objective part for imaging the second intermediate image onto the image surface;
   wherein the second objective part includes a first concave mirror having a first continuous mirror surface and a second concave mirror having a second continuous mirror surface;
   wherein pupil surfaces are formed between the object plane and the first intermediate image, between the first and the second intermediate image and between the second intermediate image and the image plane; and
   wherein all concave mirrors are arranged optically remote from a pupil surface; and a magnification ratio $|\beta|$ is in the range $0.25<|\beta|<1$.

21. Projection objective according to claim 20, wherein $0.33 \leq |\beta| 0.66$.

22. Projection objective according to claim 21, wherein $|\beta|=0.5$.

23. Projection objective according to claim 20, wherein the effective image field has an aspect ratio AR=B/A between width B and length A in a range from 2:1 to 10:1, and wherein B>50 mm and A>2 mm.

24. Projection objective according to claim 20, wherein the condition $N_L<20$ holds for the total number $N_L$ of lenses of the projection objective.

25. A catadioptric reduction projection objective for projection lithography comprising:
   a plurality of optical elements arranged along an optical axis and designed for imaging an effective object field arranged in an object surface of the projection objective into an effective image field arranged in an image surface of the projection objective;
   wherein the optical elements include at least one concave mirror and at least one transparent lens;
   wherein the projection objective has a reducing negative isotropic magnification β, such that the effective object field disposed on one side of the optical axis is imaged into the effective image field disposed on the opposite side of the optical axis without image flip, whereby no change of chirality occurs between the effective object field and the effective image field; and
   wherein $-0.3>\beta>-0.7$.

26. Projection objective according to claim 25, wherein the projection objective is an unobscured system having no pupil obscuration.

27. Projection objective according to claim 25, wherein the optical elements are configured to provide an image-side numerical aperture NA in an effective image field having a maximum image field height Y'>26 mm.

28. Projection objective according to claim 25, wherein the optical elements are configured to provide an image-side numerical aperture NA >0.6.

29. Projection objective according to claim 25, wherein the projection objective is an unobscured system having no pupil obscuration and wherein the optical elements are configured to provide an image-side numerical aperture NA>0.6 in an effective image field having a maximum image field height Y'>26 mm.

30. Projection objective according to claim 24, wherein all lenses and the at least one concave mirror share a common straight optical axis.

31. Projection objective according to claim 25, wherein the projection objective has no more than two mirrors.

32. Projection objective according to claim 31, wherein the projection objective has exactly two concave mirrors and no planar folding mirror.

33. Catadioptric reduction projection objective for imaging a pattern provided in an object surface of the projection objective onto an image surface of the projection objective comprising:
   a first, refractive objective part for imaging the pattern provided in the object plane into a first intermediate image;
   a second objective part including at least one concave mirror for imaging the first intermediate imaging into a second intermediate image;
   a third, refractive objective part for imaging the second intermediate imaging onto the image plane; wherein:
   the projection objective has a maximum lens diameter $D_{max}$, a maximum image field height Y', and an image side numerical aperture NA>0.6; wherein $$COMP1=100 \cdot D_{max}/(Y'^2 \cdot NA)$$

and wherein the condition COMP1<37 holds.

34. Projection objective according to claim 33, wherein the projection objective is an unobscured system having no pupil obscuration and wherein the optical elements are configured to provide an effective image field having a maximum image field height Y'>26 mm.

35. Projection objective according to claim 33, wherein the projection objective has no more than two mirrors.

36. Projection objective according to claim 33, wherein the projection objective has exactly two concave mirrors and no planar folding mirror.

37. Projection objective according to claim 33, wherein all lenses and the at least one concave mirror share a common straight optical axis.

38. A reduction projection objective for projection lithography comprising:
   a plurality of optical elements arranged along an optical axis and designed for imaging an effective object field arranged in an object surface of the projection objective into an effective image field arranged in an image surface of the projection objective at a reducing magnification ratio $|\beta|$, where $0.33 \leq |\beta|<0.66$;
   the optical elements being configured to form a first objective part, a dioptric second objective part and a first intermediate image disposed between the first objective part and the dioptric second objective part;
   where a size of the intermediate image is at least twice as large as a size of the effective image field.

39. Projection objective according to claim 38, wherein the first objective part is a catadioptric objective part including at least one concave mirror.

40. Projection objective according to claim 38, wherein $|\beta|=0.5$.

41. Projection objective according to claim 38, wherein the projection objective is an in-line system having one straight optical axis common to all optical elements.

42. Projection objective according to claim 38, wherein the projection objective has a number $N_L$ of lenses, a number $N_{ASP}$ of aspheric lenses and the condition AR>0.6 holds for an asphere ratio $AR=N_{ASP}/N_L$.

43. Projection objective according to claim 38, wherein the effective image field has an aspect ratio AR=B/A between width B and length A and wherein the aspect ratio is in a range from 2:1 to 10:1.

44. Projection objective according to claim 38, wherein the effective image field has a width B>50 mm and length A>2 mm.

45. Projection objective according to claim 38, wherein the projection objective is designed to form a circular exit pupil without obscuration and centered about the optical axis.

46. Projection objective according to claim 38, wherein the projection objective is designed to image an off-axis effective object field arranged entirely outside the optical axis into an off-axis image field arranged entirely outside the optical axis.

47. Projection objective according to claim 38, wherein surface vertices of all curved optical surfaces are arranged on one common optical axis.

48. Projection objective according to claim 38, wherein the optical elements are configured to provide an image-side numerical aperture 1>NA>0.6.

49. Projection objective according to claim 38, wherein the condition $N_L$<20 holds for the total number $N_L$ of lenses of the projection objective.

50. Projection objective according to claim 49, wherein $N_L \leq 16$.

51. Projection objective according to claim 38, wherein the projection objective has an even number of concave mirrors.

52. Projection objective according to claim 51, wherein the even number is two.

53. Projection objective according to claim 38, wherein at least one second intermediate image is formed in addition to the first intermediate image.

54. Projection objective according to claim 53, wherein the projection objective has, in that sequence, a first objective part for creating the first intermediate image, a second objective part for creating a second intermediate image from the first intermediate image, and a third objective part forming the image from the second intermediate image in the image surface.

55. Projection objective according to claim 54, wherein the first and third objective part are dioptric objective parts and the second objective part interposed between the first and third objective part includes at least one concave mirror.

56. Projection objective according to claim 55, wherein the second objective part includes exactly two concave mirrors.

57. Projection objective according to claim 55, wherein the second objective part includes a first concave mirror having a first continuous mirror surface and a second concave mirror having a second continuous mirror surface;

pupil surfaces are formed between the object surface and the first intermediate image, between the first and the second intermediate image and between the second intermediate image and the image surface; and all concave mirrors are arranged optically remote from a pupil surface.

\* \* \* \* \*

UNITED STATES PATENT AND TRADEMARK OFFICE
CERTIFICATE OF CORRECTION

| | |
|---|---|
| PATENT NO. | : 7,920,338 B2 |
| APPLICATION NO. | : 11/723854 |
| DATED | : April 5, 2011 |
| INVENTOR(S) | : Wilhelm Ulrich et al. |

It is certified that error appears in the above-identified patent and that said Letters Patent is hereby corrected as shown below:

Column 6, Line 2: delete "part." and insert -- part, --

Column 6, Line 7: delete "here." and insert -- here, --

Column 6, Lines 8-9: delete "Consequently." and insert -- Consequently, --

Column 6, Line 11: delete "example." and insert -- example, --

Column 6, Line 13: delete "aperture." and insert -- aperture, --

Column 6, Line 22: delete "catadiopric" and insert -- catadioptric --

Column 7, Line 43: delete "0.5))" and insert -- 0.5) --

Column 9, Line 61: delete "project" and insert -- projection --

Column 10, Line 43: delete "$1.5<|\beta_1<2.5.$" and insert -- $1.5<|\beta_1|<2.5.$ --

Signed and Sealed this
Tenth Day of July, 2012

David J. Kappos
*Director of the United States Patent and Trademark Office*